(12) United States Patent
Lai et al.

(10) Patent No.: US 6,204,096 B1
(45) Date of Patent: Mar. 20, 2001

(54) METHOD FOR REDUCING CRITICAL DIMENSION OF DUAL DAMASCENE PROCESS USING SPIN-ON-GLASS PROCESS

(75) Inventors: Yeong-Chih Lai, Nan-Tou; Chien-Chung Huang; Yu-Tai Tsai, both of Tai-Chung Hsien; Huang-Hui Wu, Chang-Hua Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/272,429

(22) Filed: Mar. 19, 1999

(51) Int. Cl.[7] .................................................. H01L 21/82
(52) U.S. Cl. ...................... 438/128; 438/624; 438/618; 438/633; 438/637; 438/692
(58) Field of Search ................................. 438/128, 633, 438/692, 637, 782, 787, 790, 778, 312, 314, 316, 724, 624, 625, 626, 618; 257/522, 758; 430/322

(56) References Cited

U.S. PATENT DOCUMENTS 4,847,183 * 7/1989 Kruger .............................. 430/322
5,578,523 * 11/1996 Fiordalice ........................... 438/633
5,736,457 * 4/1998 Zhao .................................. 438/624

* cited by examiner

Primary Examiner—Matthew Smith
Assistant Examiner—Igwe U. Anya

(57) ABSTRACT

A method for forming wiring structures in integrated circuit devices is disclosed. The method, in one embodiment, firstly providing a substrate is carried out. Then an interlayer dielectric layer is formed over the substrate. Sequentially an etching stop layer is formed and wherein the etching stop layer is patterned. Thus formation of a dielectric layer over the etching stop is achieved. Also photoresist mask is formed and defined. Therefore an opening for a via is initially formed in a second insulative layer above a first insulative layer with an etching stop layer therein. Consequentially removing the photoresist mask and then depositing a first conductive metal layer are all carried out. Again, photoresist mask is formed and defined. The next step is removing excess parts of the conductive metal. Sequentially the step is depositing a second conductive metal layer. Finally the surface of integrated circuit device is planarized herein.

12 Claims, 5 Drawing Sheets ns of the Prior Art

METHOD FOR REDUCING CRITICAL DIMENSION OF DUAL DAMASCENE PROCESS USING SPIN-ON-GLASS PROCESS

BACKGROUND OF THE INVENTION

1. Field of the Invention

The present invention relates to a semiconductor device containing an interconnection structure comprising conductive wiring on a substrate, and more particularly to a dual damascene process for forming an interconnection structure.

2. Description of the Prior Art

Normally traditional methods for forming interconnection structures conclude the use of subtractive etching or etch back step as the primary metal-patterning techniques. It was also developed as dual damascene process for a practical technique.

One such traditional technique is illustrated in part in FIGS. 1A to 1I, wherein inter-layer dielectrics layer as an oxide layer 112, such as FIG. 1A is formed on semiconductor substrate 111 that is as mono-crystalline silicon. With conductive contacts/vias 113 formed in inter-layer dielectrics layer 112 such as FIG. 1B. FIG. 1B also illustrated inter-layer dielectrics layer 114 is deposited on etching stop layer 113, such as Silicon Nitride. The interconnection structure comprises conductive contacts/vias 113 and conductive wiring 114. Then a photoresist mask 115 formed on inter-layer dielectrics layer 114 corresponding to the wiring pattern as shown FIG. 1C. After etching, as FIG. 1D, wiring line pattern is formed using lithography progress. The following step, again a photoresist layer 116 is applied to the resulting wiring pattern shown as FIG. 1E, and then the wiring pattern formed as FIG. 1F. Consequently photoresist mask is removed soon shown as FIG. 1G. Finally metal is not only deposited onto the surface of above semiconductor device but also filled up the opening as FIG. 1H. FIG. 1I shows the excess metal is removed using typically chemical mechanical polishing process.

Commonly the photoresist layer should be formed thicker for using and owning a long depth of focus in order to expose the entire thickness of the photoresist mask. However, for use of steppers that need high solution, it is difficult in forming quite deep focus in the process. Also it makes thick critical dimension happening and reduces reliability of production.

Moreover, as forming semiconductor integrated circuits devices, a first level interconnect might be formed in contact with a doped region within the substrate of an integrated circuit device. More interconnections are typically formed between the first level wiring line or interconnect and other portions of the integrated circuit device or to structures external to the integrated circuit device.

SUMMARY OF THE INVENTION

In accordance with the present invention, a method is provided for forming integrated circuit devices that substantially achieve estimated semiconductor devices completely.

The present method, in one embodiment, firstly providing a substrate is carried out. Then an interlayer dielectric layer is formed over the substrate. Sequentially an etching stop layer is formed and wherein the etching stop layer is patterned. Thus formation of a dielectric layer over the etching stop is achieved. Also photoresist mask is formed and defined. Therefore an opening for a via is initially formed in a second insulative layer above a first insulative layer with an etching stop layer therein. Consequentially removing the photoresist mask and then depositing a first conductive metal layer are all carried out. Again, photoresist mask is formed and defined. The next step is removing excess parts of the conductive metal. Sequentially the step is depositing a second conductive metal layer. Finally the surface of integrated circuit device is planarized herein.

Apparently the photoresist layer should be formed thicker for using and owning a long depth of focus in order to expose the entire thickness of the photoresist mask according to the present invention. It is for use of steppers that need not high solution, it is much easier in forming quite deep focus in the process. Also it makes thin critical dimension happening and increases reliability of production.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The method of the present invention is applied to a broad range of integrated circuits of semiconductor and can be fabricated from a variety of semiconductor device. The following description discusses several presently preferred embodiments of the device of the present invention as implemented in different sorts of semiconductor, since the majority of currently available semiconductor are fabricated and the most commonly encountered applications of the present invention will involve dual damascene process. Nevertheless, the present invention may also be advantageously employed in other advanced technology, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to form semiconductor device, it is not intended that these illustrations be a limitation on the scope or applicability of the present invention. Further, while the illustrative examples use insulated integrated circuits, it should be recognized that the insulated gate portions might be replaced with other related apparatus. Thus, it is not intended that the semiconductor devices of the present invention be limited to the structures illustrated. These devices are included to demonstrate the utility and application of the present invention to presently preferred embodiments.

One of the preferred embodiments of the present invention is shown in FIGS. 2A to 2H. In this embodiment, a substrate 11 is used to form a transistor device, which is made by dual damascene process. The processing of flowchart is described in detail below, while the processing of the substrate will be readily apparent to those skilled in the art from the detailed description.

Figure 1A:
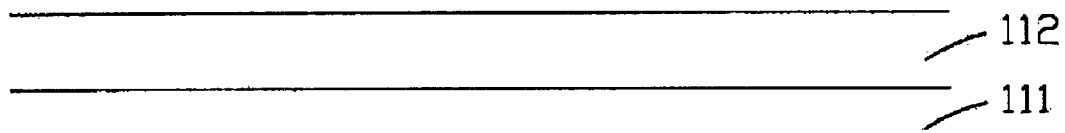
FIGS. 1A to 1I is a sectional view of a semiconductor device having a conventional method.
Figure 1B:
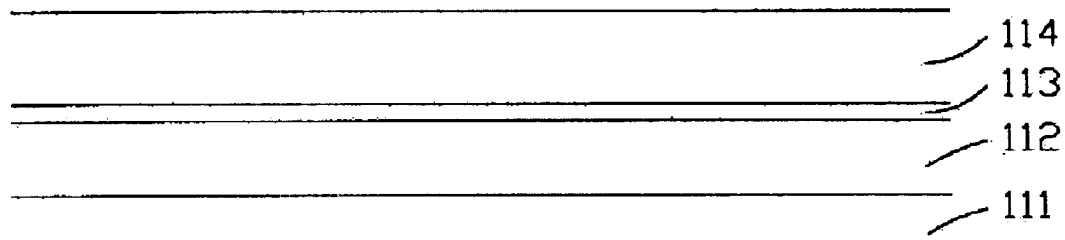
Figure 1C:
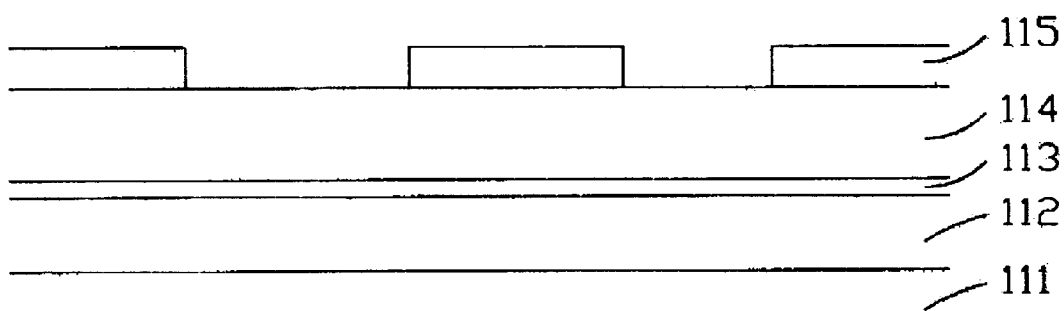
Figure 1D:
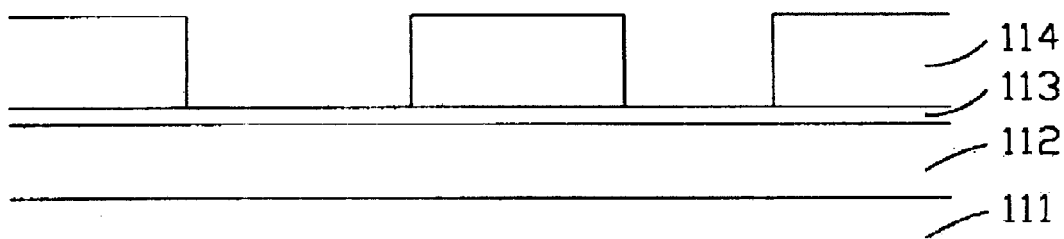
Figure 1E:
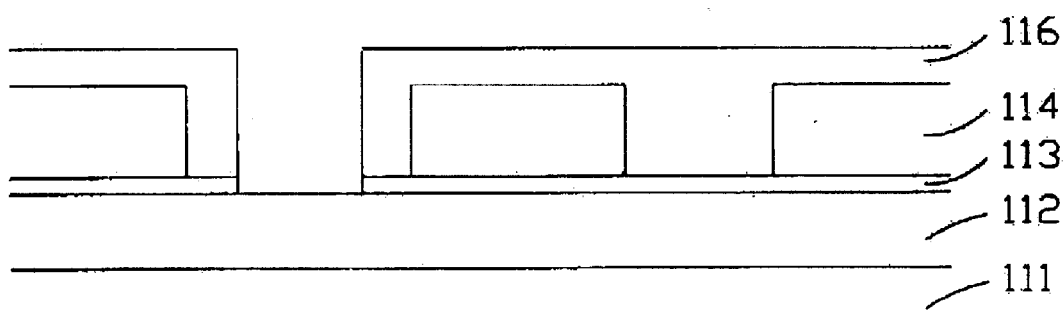
Figure 1F:
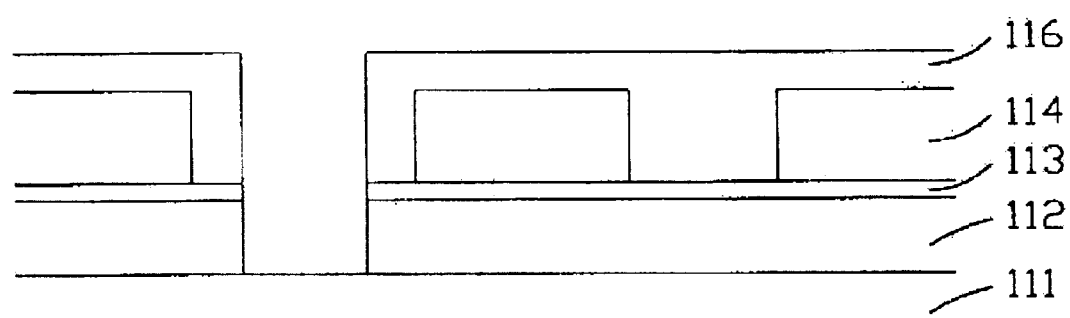
Figure 1G:
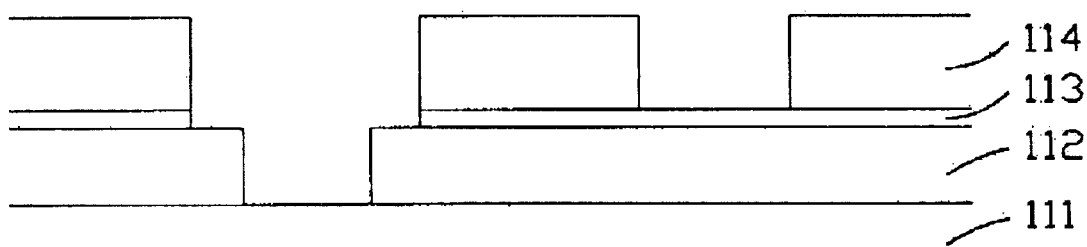
Figure 1H:
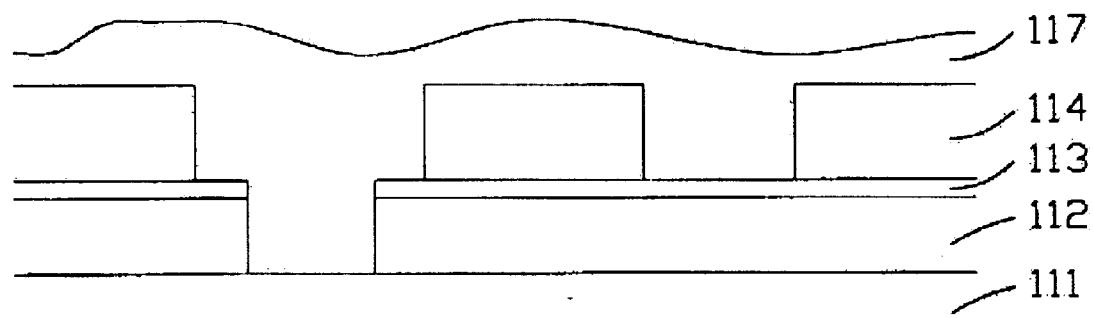
Figure 1I:
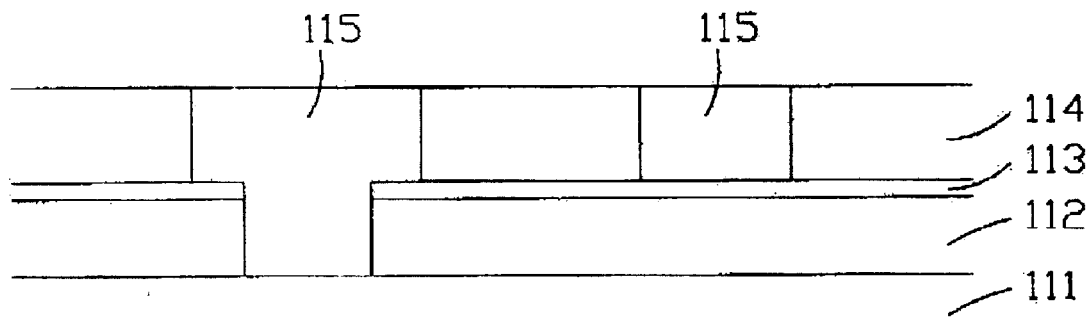
Figure 2A:
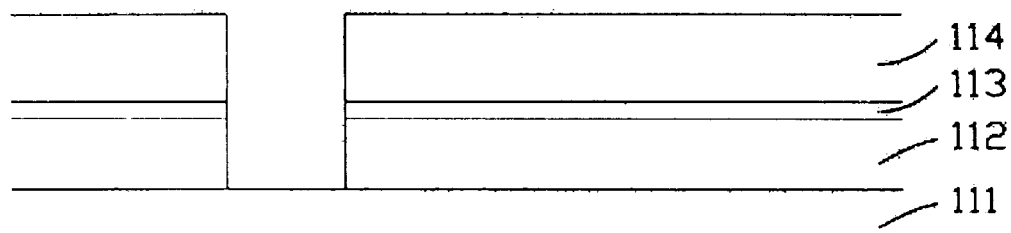
FIGS. 2A to 2H are sectional views showing in combination an embodiment of the present invention.

FIG. 2A shows a semiconductor substrate 111 formed firstly and then Silicon Oxide layer 112 is deposited onto the substrate using PECVD method, also illustrates Silicon Nitride layer 113 as an etching stop layer being deposited upon the above Silicon Oxide layer 112 applying PECVD method as well. Again, depositing an Silicon Oxide layer 114 onto the silicon nitride layer 113 is carried out employing PECVD method. Consequentially defining pattern process that is achieved.

Figure 2B:
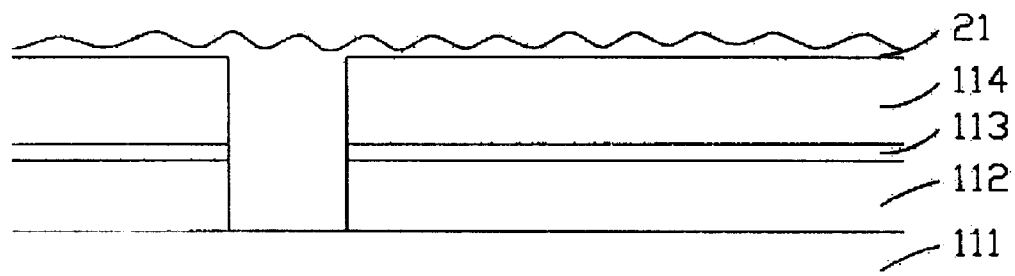
Figure 2C:
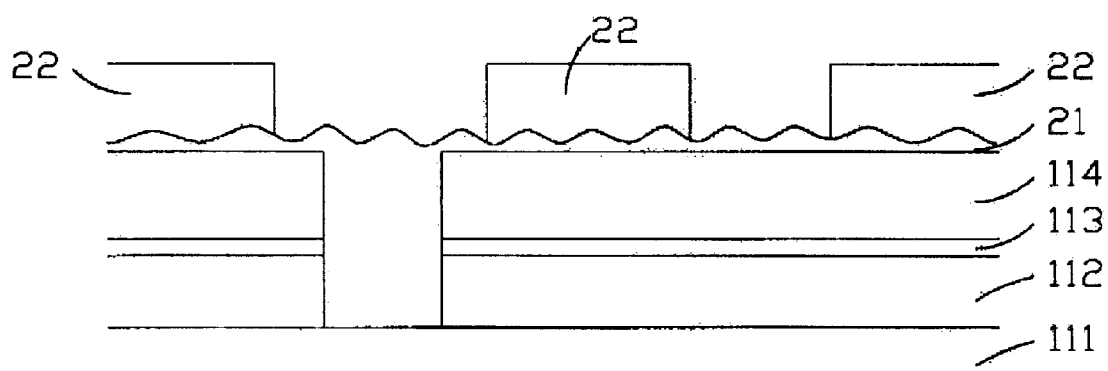
Figure 2D:
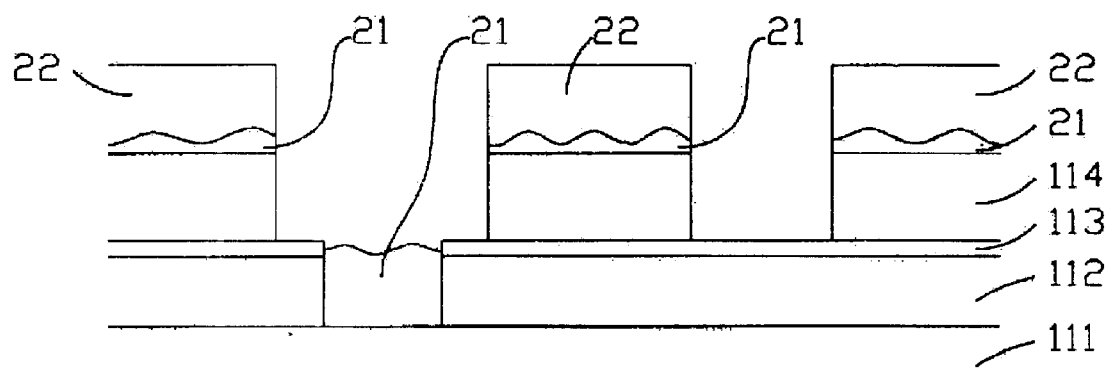
Figure 2E:
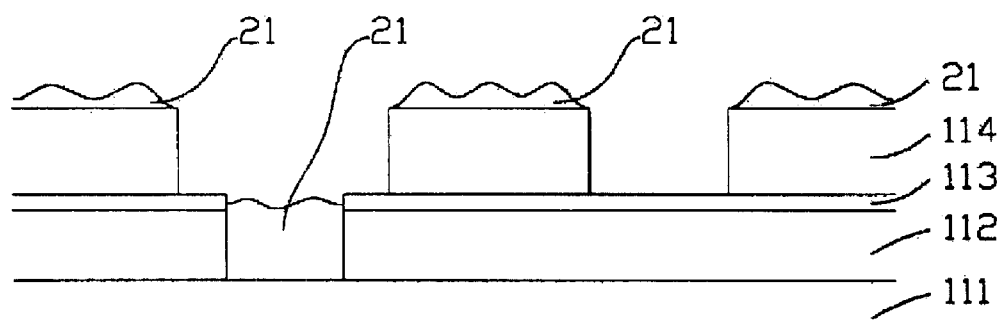
Figure 2F:
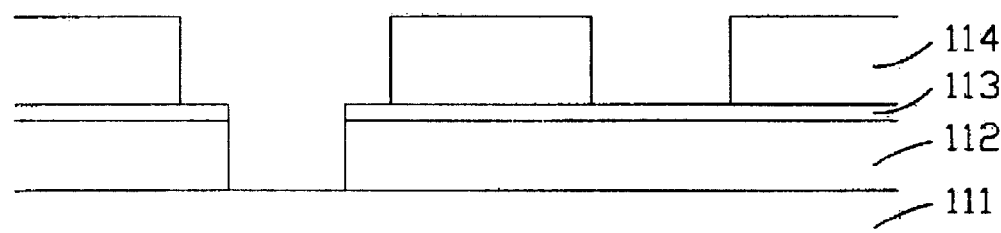

As FIG. 2B, then Spin-On-Glass layer 21 is formed employing Spin-On-Glass (S.O.G.) process for the next following steps. The surface of semiconductor device, as FIG. 2C, will be coated photoresist mask 22. Consequentially, as FIG. 2D, pattern will be defined using lithography process so that the estimated S.O.G. layer 21 and the part of silicon oxide layer 112 with S.O.G. layer 21 removed using reactive ion etching method, and then as FIG. 2D photoresist mask 22 is removed soon. FIG. 2E illustrates S.O.G. layer named as media layer is removed sequentially. Also, it may be added etching back process after this S.O.G. process. FIG. 2F, S.O.G. layer 21 is removed using diluted KOH solution or a sort of rate of one-tenth of buffered HF solution. Due to property for the selectivity of S.O.G. to $SiO_2$ is about 40/1.

Figure 2G:
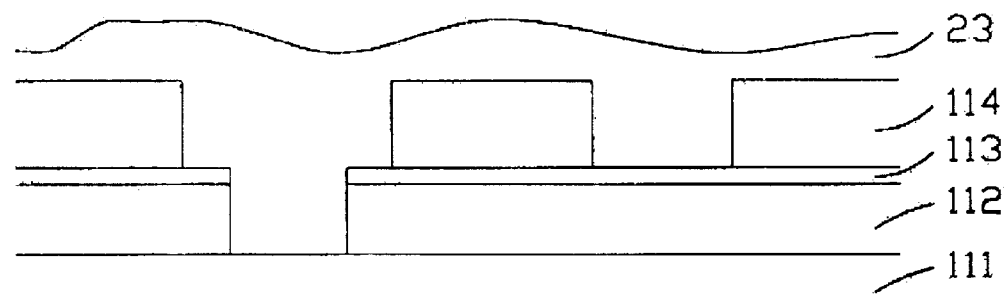
Figure 2H:
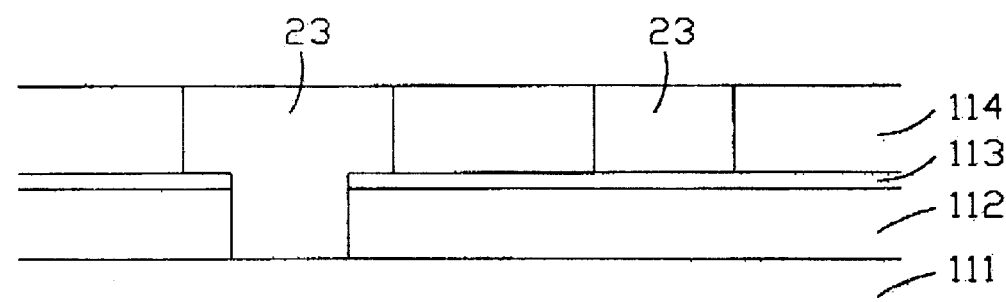

Then FIG. 2G is a dramatic picture showed metal layer 23 deposited onto the surface of semiconductor and fulfilled the opening of device employing PECVD method. FIG. 2H illustrates excess metal on the surface of this semiconductor device being removed and typically Chemical Mechanical Polishing process is carried out finally.

Therefore preferred embodiments of the present invention are now begun after formation of an integrated circuit device within substrate 111. This method of forming a conductive wiring and a via on a substrate will comprise the following steps. Firstly providing a substrate for semiconductor device and forming a first insulative layer on the substrate are carried out. Then an etching stop layer on the first insulative layer is formed. Sequentially forming a second insulative layer on said etch stop layer is achieved. Then an opening is formed in the second insulative layer at a first location where the via is desired. The opening penetrates through the second insulative layer substantially up into the etching stop layer. Consequentially forming a trench will be come true in the second insulative layer at a second location where the wiring is desired. While the opening is simultaneously extended through the etching stop layer, and through the first insulative layer wherein the trench is wider than and entirely inclusive of the opening. Then a conductive material is deposited in the opening and in the trench so that the conductive material completely fills the opening and the trench. The trench is formed as a conductive wiring, also the opening in the etching stop layer and the first insulative layer will be formed a conductive via. The conductive via providing electrical connection between a conductive wiring and the substrate. Wiring line is defined onto surface of conductive material as a pattern layer. Then photoresist mask is removed and the conductive material layer is removed as well. Again, depositing simultaneously the conductive material in the opening and in the trench is achieved, so that the conductive material completely fills the opening and the trench. The trench will be formed as a conductive wiring, the opening in the etching stop layer and the first insulative layer will be formed a conductive via. The conductive via provides electrical connection between a conductive wiring and the substrate. Finally surface of the conductive material is planarized.

Normally the first insulative layer and second insulative layer are oxide layers. The etching stop layer is a material selected from the group consisting if silicon nitride, silicon oxynitride and polysilicon, and said first and second insulative layers are silicon oxide. The step of forming a first patterned mask owns a first mask opening over the second insulative layer in registry with the first location prior to forming the opening in the second insulative layer. Usually the step of removing the first mask and providing a second mask own a second opening over the second insulative layer in registry with the second location prior to form the trench in the second insulative layer. Simultaneously forming the via through the etching stop layer and the first insulative layer is carried out. The step of forming the opening in the second insulative layer is achieved by a first etching process. A trench in the second insulative layer is formed while simultaneously forming a via in the etching stop layer and in the first insulative layer. They are both achieved by a second etching process. The first etching process and the second etching process are reactive ion etching process. First etching process owns a higher selectivity with respect to said etching stop layer than the second etching process. The step of polishing comprises the second insulative layer to planarize the conductive wiring and the second insulative layer. The step of polishing is achieved by chemical-mechanical polishing. The conductive material concludes a metal with or without an adhesion/barrier layer, therefore the metal is selected from the group consisting of aluminum, tungsten, copper and alloys thereof.

While the present invention has been described with particular reference to preferred embodiments thereof, it is to be understood that these embodiments are provided by way of example. Those of ordinary skill will readily appreciate that variations and modification can be made from these embodiments without varying from the basic teachings of the present invention. Accordingly, the scope of the present invention is not to be limited to the described preferred embodiments, but instead the scope of the present invention is to be determined by the claims, which follow.

Although specific embodiments have been illustrated and described, it will be obvious to those skilled in the art that various modifications may be made without departing from what is intended to be limited solely by the appended claims.

What is claimed is:

1. A method for controlling critical dimension of an integrated circuit device having multiple level conductive structures comprising the steps of:

providing a substrate;

forming an interlayer dielectric layer over said substrate;

forming an etching stop layer and wherein said etching stop layer being patterned;

forming a dielectric layer over said etching stop;

patterning said dielectric layer to define as wiring line;

depositing a first conductive metal layer;

patterning said first conductive layer over said etching stop and then over said interlayer dielectric layer to define as wiring line;

removing excess parts of said conductive metal;

depositing a second conductive metal layer; and planarizing said surface of integrated circuit device herein.

2. The method according to claim 1, wherein said depositing a first conductive metal comprises spin-on-glass process.

3. A method of forming a conductive wiring and a via on a substrate, comprising the steps of:

provide a substrate for semiconductor device;

forming a first insulative layer on said substrate;

forming an etching stop layer on said first insulative layer;

forming a second insulative layer on said etch stop layer;

forming an opening in said second insulative layer at a first location where said via is desired, said opening penetrating through said second insulative layer substantially up into said etching stop layer;

forming a trench in said second insulative layer at a second location where said wiring is desired while simultaneously extending said opening through said etching stop layer and through said first insulative layer wherein said trench is wider than and entirely inclusive of said opening;

depositing a first conductive metal in said opening and in said trench so that said first conductive metal completely fills said opening and said trench, said trench forming a conductive wiring, said opening in said etching stop layer and said first insulative layer forming a conductive via, said conductive via providing electrical connection between a conductive wiring and said substrate;

forming a photoresist mask on said first conductive metal layer;

defining wiring line onto surface of said first conductive metal as a pattern layer;

removing said photoresist mask;

removing said first conductive metal;

depositing simultaneously a second conductive metal in said opening and in said trench so that said conductive material completely fills said opening and said trench, said trench forming a conductive wiring, said opening in said etching stop layer and said first insulative layer forming a conductive via, said conductive via providing electrical connection between a conductive wiring and said substrate; and planarizing surface of said second conductive metal.

4. The method according to claim 3, wherein the first insulative layer and second insulative layer are oxide layers.

5. The method according to claim 3, wherein said etching stop layer is a material selected from the group consisting if silicon nitride, silicon oxynitride and polysilicon, and said first and second insulative layers are silicon oxide.

6. The method according to claim 3, comprising said step of removing said first mask and providing a second mask having a second opening over said second insulative layer in registry with the second location prior to forming said trench in said second insulative layer and simultaneously forming said via through said etching stop layer and said first insulative layer.

7. The method according to claim 3, wherein said step of forming said opening in said second insulative layer is achieved by a first etching process.

8. The method as recited in claim 7, wherein the step of forming a trench in the second insulative layer while simultaneously forming a via in said etching stop layer and in said first insulative layer is achieved by a second etching process.

9. The method as recited in claim 8, wherein the first etching process and the second etching process are reactive ion etching process.

10. The method according to claim 8, wherein said first etching process has a higher selectivity with respect to said etching stop layer than said second etching process.

11. The method according to claim 3, wherein said conductive material comprises a metal with or without an adhesion/barrier layer, said metal selected from the group consisting of aluminum, tungsten, copper and alloys thereof.

12. The method according to claim 3, wherein removing said first conductive metal comprises a solution selected from the group consisting of a rate of one-tenth buffered HF and diluted KOH solution.

* * * * *